(12) United States Patent
Derner et al.

(10) Patent No.: US 10,153,281 B2
(45) Date of Patent: Dec. 11, 2018

(54) MEMORY CELLS AND MEMORY ARRAYS

(71) Applicant: Micron Technology, Inc., Boise, ID (US)

(72) Inventors: Scott J. Derner, Boise, ID (US); Michael Amiel Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/664,143

(22) Filed: Jul. 31, 2017

(65) Prior Publication Data

US 2018/0061834 A1    Mar. 1, 2018

Related U.S. Application Data

(60) Provisional application No. 62/381,736, filed on Aug. 31, 2016.

(51) Int. Cl.
  *H01L 27/108*   (2006.01)
  *H01L 27/07*    (2006.01)
  (Continued)

(52) U.S. Cl.
  CPC .......... *H01L 27/108* (2013.01); *G11C 11/403* (2013.01); *H01L 27/07* (2013.01);
  (Continued)

(58) Field of Classification Search
  CPC ... H01L 27/108; H01L 27/07; H01L 29/7827; H01L 29/1037; H01L 29/0847; H01L 28/60; H01L 23/528; G11C 11/403
  See application file for complete search history.

(56) References Cited

U.S. PATENT DOCUMENTS

| | | |
|---|---|---|
| 4,103,342 A | 7/1978 | Miersch et al. |
| 5,299,155 A | 3/1994 | Yanagi |
| | (Continued) | |

FOREIGN PATENT DOCUMENTS

| | | |
|---|---|---|
| WO | PCT/US2017/044611 | 11/2017 |
| WO | PCT/US2017/044633 | 11/2017 |
| | (Continued) | |

OTHER PUBLICATIONS

Henkels et al., "Large-Signal 2T, 1C DRAM Cell: Signal and Layout Analysis", IEEE Journal of Solid-State Circuits, vol. 29(7), Jul. 1994, pp. 829-832.

(Continued)

*Primary Examiner* — Robert T Huber
*Assistant Examiner* — Gardner W. S. Swan
(74) *Attorney, Agent, or Firm* — Wells St. John P.S.

(57) ABSTRACT

Some embodiments include a memory cell having first and second transistors and first and second capacitors. The first capacitor is vertically displaced relative to the first transistor. The first capacitor has a first node electrically coupled with a source/drain region of the first transistor, a second node electrically coupled with a common plate structure, and a first capacitor dielectric material between the first and second nodes. The second capacitor is vertically displaced relative to the second transistor. The second capacitor has a third node electrically coupled with a source/drain region of the second transistor, a fourth node electrically coupled with the common plate structure, and a second capacitor dielectric material between the first and second nodes. Some embodiments include memory arrays having 2T-2C memory cells.

5 Claims, 5 Drawing Sheets

(51) Int. Cl.
  *H01L 49/02* (2006.01)
  *H01L 29/78* (2006.01)
  *G11C 11/403* (2006.01)
  *H01L 23/528* (2006.01)
  *H01L 29/08* (2006.01)
  *H01L 29/10* (2006.01)

(52) U.S. Cl.
  CPC .......... *H01L 28/60* (2013.01); *H01L 29/7827* (2013.01); *H01L 23/528* (2013.01); *H01L 29/0847* (2013.01); *H01L 29/1037* (2013.01)

(56) References Cited

U.S. PATENT DOCUMENTS

| | | |
|---|---|---|
| 5,389,810 A | 2/1995 | Agata |
| 5,571,743 A | 11/1996 | Henkels et al. |
| 5,646,900 A | 7/1997 | Tsukude et al. |
| 6,563,727 B1 | 5/2003 | Roth et al. |
| 6,720,609 B2 | 4/2004 | Deboer et al. |
| 6,744,087 B2 | 6/2004 | Misewich et al. |
| 6,961,271 B2 | 11/2005 | Jeon et al. |
| 7,330,388 B1 | 2/2008 | Chapman et al. |
| 7,378,702 B2 | 5/2008 | Lee |
| 7,558,097 B2 | 7/2009 | Khellah et al. |
| 7,697,318 B2 | 4/2010 | Fukuda et al. |
| 8,212,311 B2 | 7/2012 | Masuoka et al. |
| 9,343,507 B2 | 5/2016 | Takaki |
| 9,378,780 B1 | 6/2016 | Chang et al. |
| 2001/0053088 A1 | 12/2001 | Forbes |
| 2003/0087499 A1 | 5/2003 | Lane et al. |
| 2003/0169616 A1 | 9/2003 | Noro |
| 2003/0173593 A1* | 9/2003 | Miyatake .................. G11C 7/18 257/200 |
| 2003/0202391 A1 | 10/2003 | Nishimura et al. |
| 2003/0234413 A1 | 12/2003 | Sberno et al. |
| 2004/0062101 A1 | 4/2004 | Kasuga |
| 2004/0151020 A1 | 8/2004 | Beer |
| 2004/0174733 A1 | 9/2004 | Kirihata et al. |
| 2004/0232497 A1 | 11/2004 | Akiyama |
| 2004/0252542 A1 | 12/2004 | Hoya et al. |
| 2006/0028859 A1 | 2/2006 | Forbes |
| 2006/0211194 A1* | 9/2006 | Haller .................. H01L 27/0218 438/239 |
| 2007/0034928 A1 | 2/2007 | Cook et al. |
| 2007/0295995 A1* | 12/2007 | Yun .................. H01L 27/10885 257/202 |
| 2009/0008691 A1 | 1/2009 | Lee et al. |
| 2009/0108881 A1 | 4/2009 | Wilson |
| 2009/0168489 A1 | 7/2009 | Madan et al. |
| 2010/0238697 A1 | 9/2010 | Juengling |
| 2010/0264484 A1 | 10/2010 | Masuoka et al. |
| 2010/0295110 A1 | 11/2010 | Takaishi |
| 2012/0153371 A1 | 6/2012 | Chen et al. |
| 2013/0161607 A1* | 6/2013 | Yoneda ................ H01L 27/0688 257/43 |
| 2013/0221356 A1 | 8/2013 | Yamazaki |
| 2013/0235641 A1 | 9/2013 | Iwaki |
| 2013/0235642 A1 | 9/2013 | Heineck et al. |
| 2014/0035018 A1 | 2/2014 | Lee |
| 2014/0220749 A1 | 8/2014 | Rutter |
| 2015/0041885 A1 | 2/2015 | Yoshida et al. |
| 2015/0318285 A1 | 11/2015 | Zhang |
| 2016/0079247 A1 | 3/2016 | Lim et al. |
| 2018/0061835 A1 | 3/2018 | Yang et al. |

FOREIGN PATENT DOCUMENTS

| | | |
|---|---|---|
| WO | PCT/US2017/044638 | 11/2017 |
| WO | PCT/US2017/044653 | 11/2017 |
| WO | PCT/US2017/044661 | 11/2017 |
| WO | PCT/US2017/045052 | 11/2017 |
| WO | PCT/US2017/068227 | 4/2018 |

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.

* cited by examiner

MEMORY CELLS AND MEMORY ARRAYS

RELATED PATENT DATA

This patent claims priority to U.S. Provisional Patent Application Ser. No. 62/381,736, which was filed Aug. 31, 2016.

TECHNICAL FIELD

Memory cells, such as memory cells having two transistors and two capacitors (i.e., 2T-2C memory cells). Memory arrays comprising 2T-2C memory cells.

BACKGROUND

Dynamic Random Access Memory (DRAM) is utilized in modern computing architectures. DRAM may provide advantages of structural simplicity, low cost and speed in comparison to alternative types of memory.

Presently, DRAM commonly utilizes memory cells having one capacitor in combination with a transistor (so-called 1T-1C memory cells), with the capacitor being coupled with a source/drain region of the transistor. One of the limitations to scalability of present 1T-1C configurations is that it is proving difficult to incorporate capacitors having sufficiently high capacitance into highly-integrated architectures. Accordingly, it would be desirable to develop new memory cell configurations suitable for incorporation into highly-integrated modern memory architectures.

Figure 1:
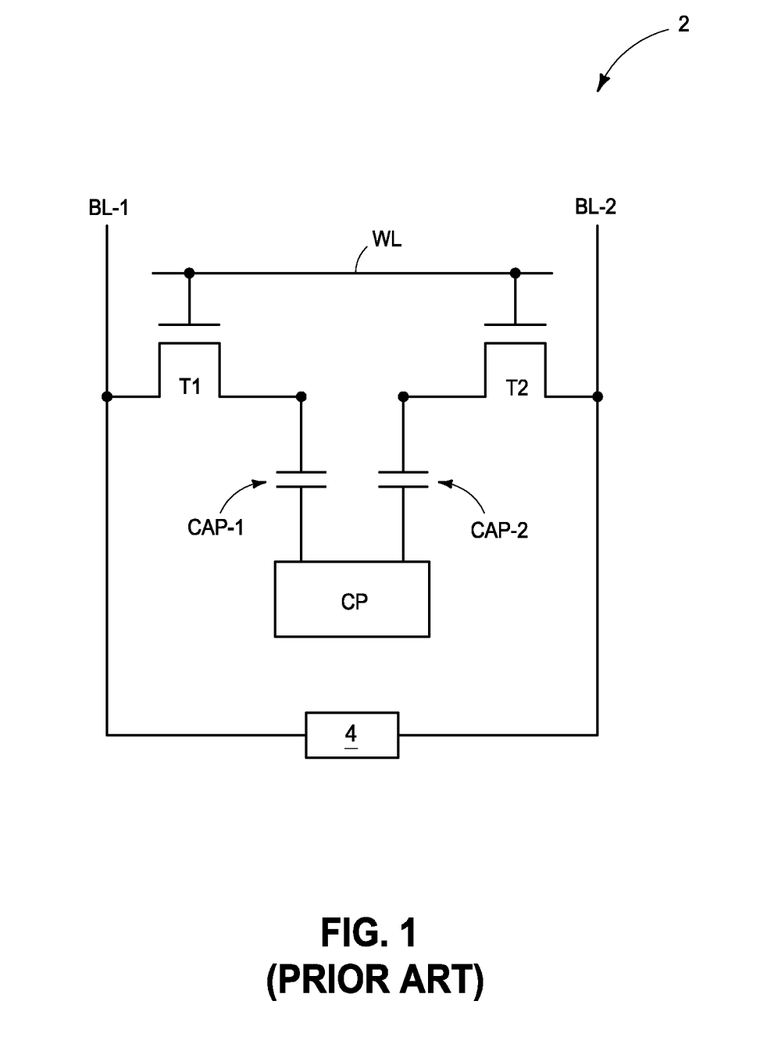
FIG. 1 is a schematic diagram of a prior art memory cell having 2 transistors and 2 capacitors.

Another prior art memory cell configuration, alternative to the 1T-1C configuration, is a configuration which utilizes two capacitors in combination with two transistors. Such configuration may be referred to as a 2T-2C memory cell. A 2T-2C memory cell is schematically illustrated in FIG. 1 as a memory cell 2. The two transistors of the memory cell are labeled as T1 and T2, and the two capacitors are labeled as CAP-1 and CAP-2.

A source/drain region of the first transistor T1 connects with a node of the first capacitor (CAP-1), and the other source/drain region of T1 connects with a first comparative bitline (BL-1). A gate of T1 connects with a wordline (WL). A source/drain region of the second transistor T2 connects with a node of the second capacitor (CAP-2), and the other source/drain region of T2 connects with a second comparative bitline BL-2. A gate of T2 connects with the wordline (WL). Each of the first and second capacitors (CAP-1 and CAP-2) has a node electrically coupled with a common plate (CP). The common plate may be coupled with any suitable voltage, such as a voltage within a range of from greater than or equal to ground to less than or equal to VCC (i.e., ground≤CP≤VCC). In some applications the common plate is at a voltage of about one-half VCC (i.e., about VCC/2).

The comparative bitlines BL-1 and BL-2 extend to circuitry 4 which compares electrical properties (e.g., voltage) of the two to ascertain a memory state of memory cell 2. An advantage of the 2T-2C memory cell is that a memory state may be ascertained by comparing the electrical properties of the two comparative bitlines BL-1 and BL-2 to one another. Accordingly, a reference bitline associated with prior art memory (for instance, 1T-1C memory) may be omitted.

It would be desirable to develop 2T-2C configurations suitable for incorporation into highly-integrated modern memory architectures.

DETAILED DESCRIPTION OF THE ILLUSTRATED EMBODIMENTS

Some embodiments include 2T-2C configurations in which two or more components are vertically stacked relative to one another in order to increase integration. The 2T-2C configurations described herein may be utilized in DRAM (dynamic random access memory) and/or other types of memory. Among the possible advantages of 2T-2C memory cells relative to conventional 1T-1C memory cells are elimination of a reference bitline (as described above in the "Background" section) and doubling of the magnitude of a sense signal. Additionally, since both plates of a capacitor cell may be electrically floating in a non-accessed data state, some mechanisms of "disturb" (e.g., cross-talk between adjacent memory cells of a memory array) may be reduced or eliminated. Example embodiment 2T-2C memory configurations are described below with reference to FIGS. 2-5.

Figure 2:
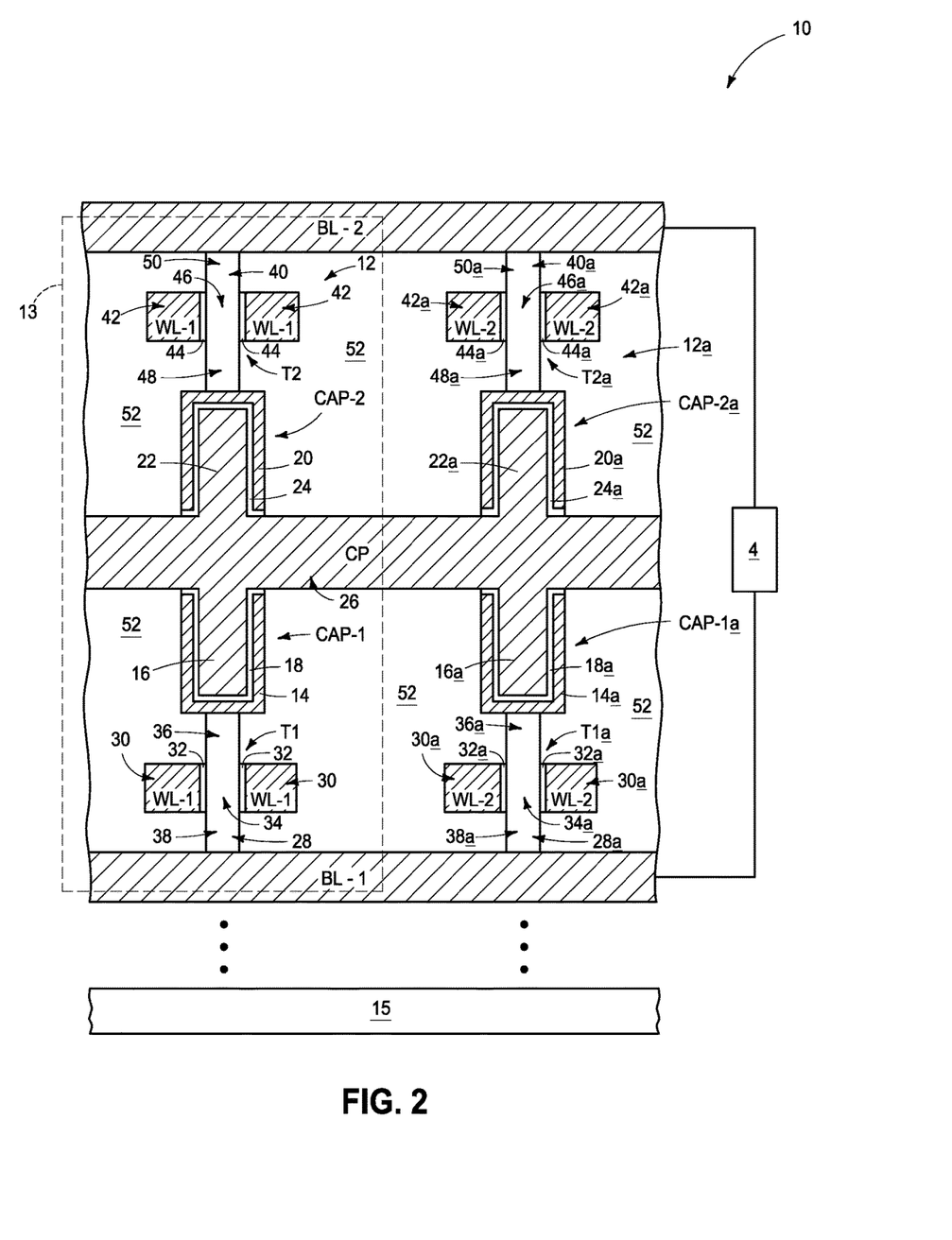
FIGS. 2-5 are diagrammatic cross-sectional side views of regions of example memory arrays showing example embodiment configurations of memory cells having two transistors and two capacitors.

FIG. 2 shows a region of a memory array 10 comprising example 2T-2C memory cells. Specifically, a pair of adjacent memory cells 12 and 12a are illustrated. A dashed line 13 demarcates an approximate boundary of the memory cell 12. The memory cells 12 and 12a are substantially identical to one another, with the term "substantially identical" meaning that the memory cells are identical to within reasonable tolerances of fabrication and measurement.

The illustrated portion of memory array 10 is supported by a base 15. The base 15 may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 15 may correspond to a semiconductor substrate containing one or more materials associated with integrated circuit fabrication. Such materials may include, for example, one or more of refractory metal materials, barrier materials, diffusion materials, insulator materials, etc. The base 15 is shown to be spaced from components of array 10 to indicate that other circuitry or components may be between array 10 and the base. An interlayer insulating film may intervene between the base 15 and the array 10. The interlayer insulating film may comprise, for example, silicon oxide.

The adjacent memory cells 12 and 12a are in a common column as one another within the memory array (i.e., are along a common bitline). The memory cells 12 and 12a are shown along comparative bitlines BL-1 and BL-2, and the comparative bitlines BL-1 and BL-2 together function as a bitline of the memory array. The comparative bitlines BL-1 and BL-2 are electrically coupled with circuitry 4 of the type described above with reference to FIG. 1. Circuitry 4 may be in any suitable location relative to array 10, and may be, for example, between array 10 and base 15, laterally offset from array 10, etc. Circuitry 4 may be further incorporated into the base 15 as a sense amplifier together with other electrical circuits that may be used to access to the array 10 to read or write data from or into the array 10. In applications where an interlayer insulating film intervenes between the array 10 and the base 15, a plurality of vias may be formed in the interlayer insulating film to electrically connect wordlines WL-1 and WL-2 and bitlines BL-1 and BL-2 of the array 10 to the circuits such as the sense amplifiers 4 that are formed in the base 15. The bitline BL-1 may be located on the interlayer insulating film.

The memory cell 12 comprises first and second transistors T1 and T2, and comprises first and second capacitors CAP-1 and CAP-2 between the first and second transistors.

The first capacitor CAP-1 comprises a first conductive node 14, a second conductive node 16, and a first capacitor dielectric material 18 between the first and second conductive nodes. Similarly, the second capacitor CAP-2 comprises a third conductive node 20, a fourth conductive node 22, and second capacitor dielectric material 24 between the third and fourth conductive nodes.

The conductive materials of the first, second, third and fourth nodes 14, 16, 20 and 22 may be any suitable conductive materials, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. Some or all of the nodes 14, 16, 20 and 22 may comprise the same composition as one another, or may comprise different compositions relative to one another.

The capacitor dielectric materials 18 and 24 may comprise any suitable composition (e.g., non-ferroelectric material, ferroelectric material and magnetic material) or combination of compositions. In some embodiments the capacitor dielectric materials may comprise non-ferroelectric material and may, for example, consist of one or more of silicon dioxide, silicon nitride, aluminum oxide, hafnium oxide, zirconium oxide, etc. In some embodiments the capacitor dielectric materials may comprise ferroelectric material. For instance, the capacitor dielectric materials may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element. In some embodiments the capacitor dielectric materials 18 and 24 may comprise a same composition as one another, and in other embodiments may comprise different compositions relative to one another.

In the shown embodiment the first and third conductive nodes 14 and 20 are container-shaped outer nodes, and the second and fourth conductive nodes 16 and 22 are inner nodes which extend into the container-shaped outer nodes. In other embodiments the first and third conductive nodes 14 and 20 may be container-shaped nodes, and the second and fourth conductive nodes 16 and 22 may surround inner and outer surfaces of the container-shaped nodes. In other embodiments the first and third conductive nodes 14 and 20 may be pillar-shaped inner nodes, and the second and fourth conductive nodes 16 and 22 may be container-shaped outer nodes which surround outer surfaces of the pillar-shaped inner nodes. In other embodiments the first and third conductive nodes 14 and 20 may have other configurations, and the second and fourth nodes 16 and 22 may also have other configurations.

The second and fourth conductive nodes 16 and 22 are electrically coupled with a common plate (CP) structure 26. In the illustrated embodiment the conductive nodes 16 and 22 share a common composition with structure 26. In other embodiments the structure 26 may comprise a different composition as compared to the conductive nodes 16 and 22. Structure 26 may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The first and second capacitors, CAP-1 and CAP-2, are vertically displaced relative to one another, with the second capacitor CAP-2 being above the first capacitor CAP-1. The first transistor T1 is between the first capacitor CAP-1 and the first comparative bitline BL-1, and the second transistor T2 is between the second capacitor CAP-2 and the second comparative bitline BL-2.

In the shown embodiment a first semiconductor pillar 28 extends upwardly from the first comparative bitline BL-1 to the first conductive (or outer conductive) node 14 of the first capacitor CAP-1, and the first transistor T1 is along such first semiconductor pillar 28. The first transistor T1 has a first conductive transistor gate 30 which is spaced from the semiconductor pillar 28 by gate dielectric material 32. The first transistor T1 has a first channel region 34 within semiconductor pillar 28 and along the gate dielectric material 32, and has first and second source/drain regions 36 and 38 within the semiconductor pillar and on opposing sides of the channel region 34. The first source/drain region 36 is electrically coupled with the first conductive node 14 of first capacitor CAP-1, and the second source/drain region 38 is electrically coupled with the first comparative bitline BL-1. In the shown embodiment the first source/drain region 36 extends to the first conductive node 14 of the first capacitor CAP-1. In other embodiments the first source/drain region 36 may extend to an electrical interconnect which in turn extends to the first conductive node 14 of the first capacitor CAP-1. Also, in the shown embodiment the second source/drain region 38 extends to the first comparative bitline BL-1. In other embodiments the second source/drain region 38 may extend to an electrical interconnect which in turn extends to the first comparative bitline BL-1.

The semiconductor pillar 28 may comprise any suitable semiconductor materials including, for example, one or both of silicon and germanium. The source/drain regions 36/38 and channel region 34 may be doped with any suitable dopants. In some embodiments the source/drain regions 36/38 may be n-type majority doped, and in other embodiments may be p-type majority doped.

A second semiconductor pillar 40 extends downwardly from the second comparative bitline BL-2 to the outer node 20 of the second capacitor CAP-2, and the second transistor T2 is along such second semiconductor pillar 40. The second transistor T2 has a second conductive transistor gate 42 which is spaced from the semiconductor pillar 40 by gate dielectric material 44. The second transistor T2 has a second channel region 46 within the semiconductor pillar 40 and along the gate dielectric material 44, and has third and fourth source/drain regions 48 and 50 within the semiconductor pillar and on opposing sides of the channel region 46. The third source/drain region 48 is electrically coupled with the third conductive node 20 of second capacitor CAP-2, and the fourth source/drain region 50 is electrically coupled with the second comparative bitline BL-2. In the shown embodiment the third source/drain region 48 extends to the third conductive node 20 of the second capacitor CAP-2. In other embodiments the third source/drain region 48 may extend to an electrical interconnect which in turn extends to the third conductive node 20 of the second capacitor CAP-2. Also, in the shown embodiment the fourth source/drain region 50 extends to the second comparative bitline BL-2. In other embodiments the fourth source/drain region 50 may extend to an electrical interconnect which in turn extends to the second comparative bitline BL-2.

The semiconductor pillar 40 may comprise any suitable semiconductor materials including, for example, one or both of silicon and germanium. The source/drain regions 48/50 and channel region 46 may be doped with any suitable dopants. In some embodiments the source/drain regions 48/50 may be n-type majority doped, and in other embodiments may be p-type majority doped.

The conductive gates 30 and 42 of the first and second transistors T1 and T2 are electrically coupled with a first wordline WL-1. Such first wordline WL-1 may extend in and out of the page relative to the cross-section of FIG. 2.

The memory cell 12a is similar to memory cell 12, and comprises first and second capacitors CAP-1a and CAP-2a together with first and second transistors T1a and T2a. The first and second transistors comprise conductive gates 30a and 42a which are electrically coupled with a second wordline WL-2. Accordingly, the second memory cell 12a is along a different row (i.e. wordline) than the first memory cell 12 within the memory array 10.

The wordlines (WL-1 and WL-2) and comparative bitlines (BL-1 and BL-2) may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The wordlines and comparative bitlines may comprise the same composition as one another, or may comprise different compositions relative to one another.

Insulative material 52 is shown to surround the various components of memory cells 12 and 12a. Such insulative material may comprise any suitable composition or combination of compositions; including, for example, one or more of silicon dioxide, silicon nitride, borophosphosilicate glass, spin-on dielectric, etc. Although insulative material 52 is shown as a single homogeneous material, in other embodiments the insulative material may include two or more discrete insulative compositions.

In the illustrated embodiment of FIG. 2 the common plate structure 26 is a rail extending horizontally along the column defined by the comparative bitlines BL-1 and BL-2. Such rail is shared by the memory cells 12 and 12a, as well as by all other memory cells along such column. In other embodiments the common plate structure may be subdivided into a plurality of separate common plate structures. For instance, FIG. 3 shows a portion of an example embodiment memory array 200 in which the rail 26 of FIG. 2 is replaced by a plurality of common plate structures 54, 54a, etc., with such common plate structures being in one-to-one correspondence with the memory cells 12, 12a, etc. of the memory array.

Figure 3:
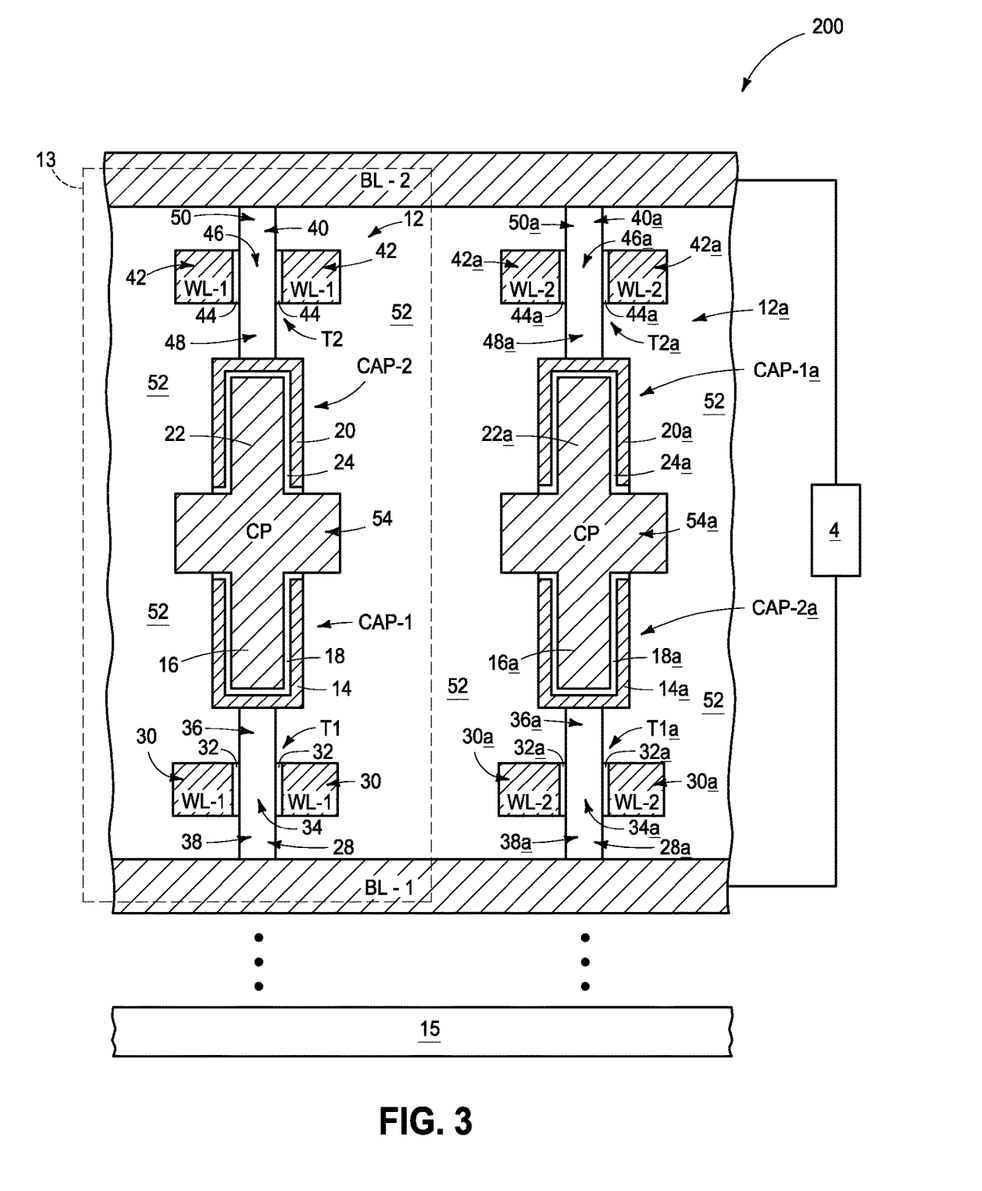

In the illustrated embodiments of FIGS. 2 and 3 the first and second transistors T1 and T2 of the memory cell 12 are vertically displaced relative to one another, as are the first and second capacitors CAP-1 and CAP-2. Further, the first and second capacitors, and first and second transistors, are in a common vertical plane as one another (i.e., are vertically stacked one atop another). In other embodiments the first and second capacitors, and/or first and second transistors, may be provided in different configurations.

Figure 4:
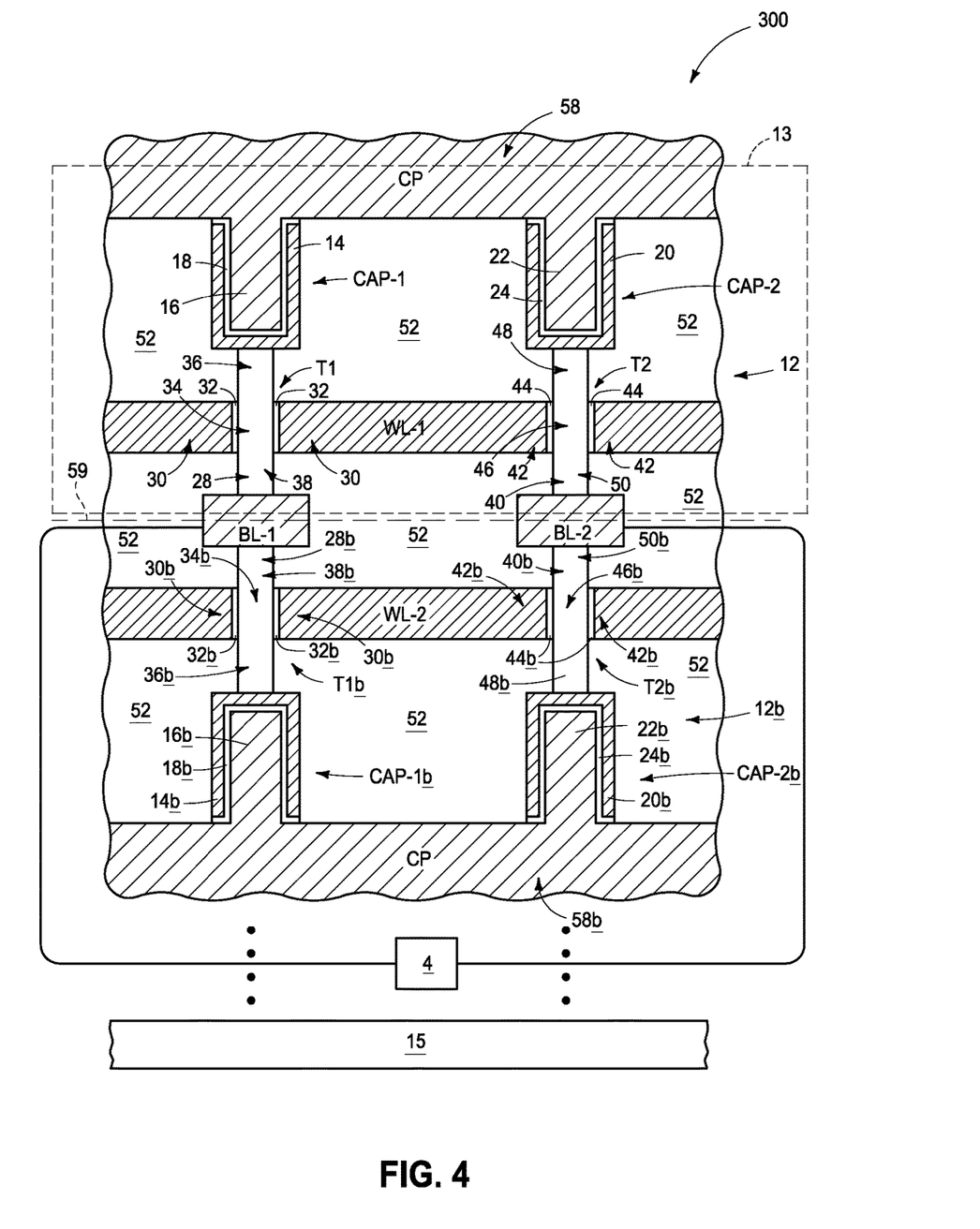

FIG. 4 shows a portion of a memory array 300 comprising a pair of memory cells 12 and 12b, with the cell 12 being vertically stacked over the cell 12b. A dashed line 13 demarcates an approximate boundary of the memory cell 12.

The illustrated portion of memory array 300 is supported by a base 15.

Comparative bitlines BL-1 and BL-2 are between the memory cells 12 and 12b, and extend in and out of the page relative to the cross-section of FIG. 4. The comparative bitlines BL-1 and BL-2 are electrically coupled with circuitry 4 of the type described above with reference to FIG. 1. The comparative bitlines BL-1 and BL-2 are shared by the memory cells 12 and 12b.

The memory cell 12 comprises first and second transistors T1 and T2 which are laterally displaced relative to one another. The memory cell 12 comprises the first capacitor CAP-1 above the first transistor T1, and comprises the second capacitor CAP-2 above the second transistor T2.

The first capacitor CAP-1 comprises the first conductive node 14, second conductive node 16, and first capacitor dielectric material 18; and the second capacitor CAP-2 comprises the third conductive node 20, fourth conductive node 22, and second capacitor dielectric material 24.

The second and fourth conductive nodes 16 and 22 are electrically coupled with a common plate (CP) structure 58 provided above the first and second capacitors CAP-1 and CAP-2. In the illustrated embodiment the conductive nodes 16 and 22 share a common composition with structure 58. In other embodiments the structure 58 may comprise a different composition as compared to the conductive nodes 16 and 22. The structure 58 may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The first and second capacitors CAP-1 and CAP-2 are laterally displaced relative to one another, and in the shown embodiment are in a same horizontal plane as one another (i.e., are horizontally aligned with one another).

The first transistor T1 is between the first capacitor CAP-1 and the first comparative bitline BL-1, and the second transistor T2 is between the second capacitor CAP-2 and the second comparative bitline BL-2. In the shown embodiment the first and second transistors (T1 and T2) are in a common horizontal plane as one another, and the wordline WL-1 extends along such horizontal plane and comprises the gates 30 and 42 of the first and second transistors.

The first semiconductor pillar 28 extends upwardly from the first comparative bitline BL-1 to the first conductive (or outer conductive) node 14 of the first capacitor CAP-1, and the first transistor T1 is along such first semiconductor pillar 28. The second semiconductor pillar 40 extends upwardly from the second comparative bitline BL-2 to the second conductive (or outer conductive) node 20 of the second capacitor CAP-2, and the second transistor T2 is along such second semiconductor pillar 40.

The first transistor T1 includes the gate dielectric material 32, the first channel region 34, and the first and second source/drain regions 36 and 38. The first source/drain region 36 is electrically coupled with the first conductive node 14 of first capacitor CAP-1, and the second source/drain region 38 is electrically coupled with the first comparative bitline BL-1.

The second transistor T2 includes the gate dielectric material 44, the second channel region 46, and the third and fourth source/drain regions 48 and 50. The third source/drain region 48 is electrically coupled with the third conductive node 20 of second capacitor CAP-2, and the fourth source/drain region 50 is electrically coupled with the second comparative bitline BL-2.

The memory cell 12b is similar to memory cell 12, and comprises first and second capacitors CAP-1b and CAP-2b together with first and second transistors T1b and T2b. The first and second transistors comprise conductive gates 30b and 42b which are electrically coupled with a second wordline WL-2. The second and fourth conductive nodes (or inner conductive nodes) 16b and 22b of the first and second capacitors CAP-1b and CAP-2b are electrically coupled with a common plate structure 58b provided beneath the capacitors CAP-1b and CAP-2b.

In the illustrated embodiment the first and second comparative bitlines BL-1 and BL-2 are in a common horizontal plane as one another. An axis 59 extending through the comparative bitlines BL-1 and BL-2 may be considered to define a mirror plane. The memory cell 12b may be considered to be a substantially mirror image of the memory cell 12 across the mirror plane. The term "substantially mirror image" is utilized to indicate that the memory cell 12b may be a mirror image of the memory cell 12 to within reasonable tolerances of fabrication and measurement.

In some embodiments the configuration of FIGS. 2 and 3 may be considered to comprise memory cells within $4F^2$ architecture, and the configuration of FIG. 4 may be considered to comprise memory cells within $8F^2$ architecture.

In the illustrated embodiment of FIG. 4 the first and second comparative bitlines BL-1 and BL-2 are shared by the memory cells 12 and 12b. In other embodiments an electrically conductive rail at common plate voltage may be shared by memory cells which are vertically disposed on opposing sides of the rail from one another, with FIG. 5 illustrating an example of such other embodiments.

Figure 5:
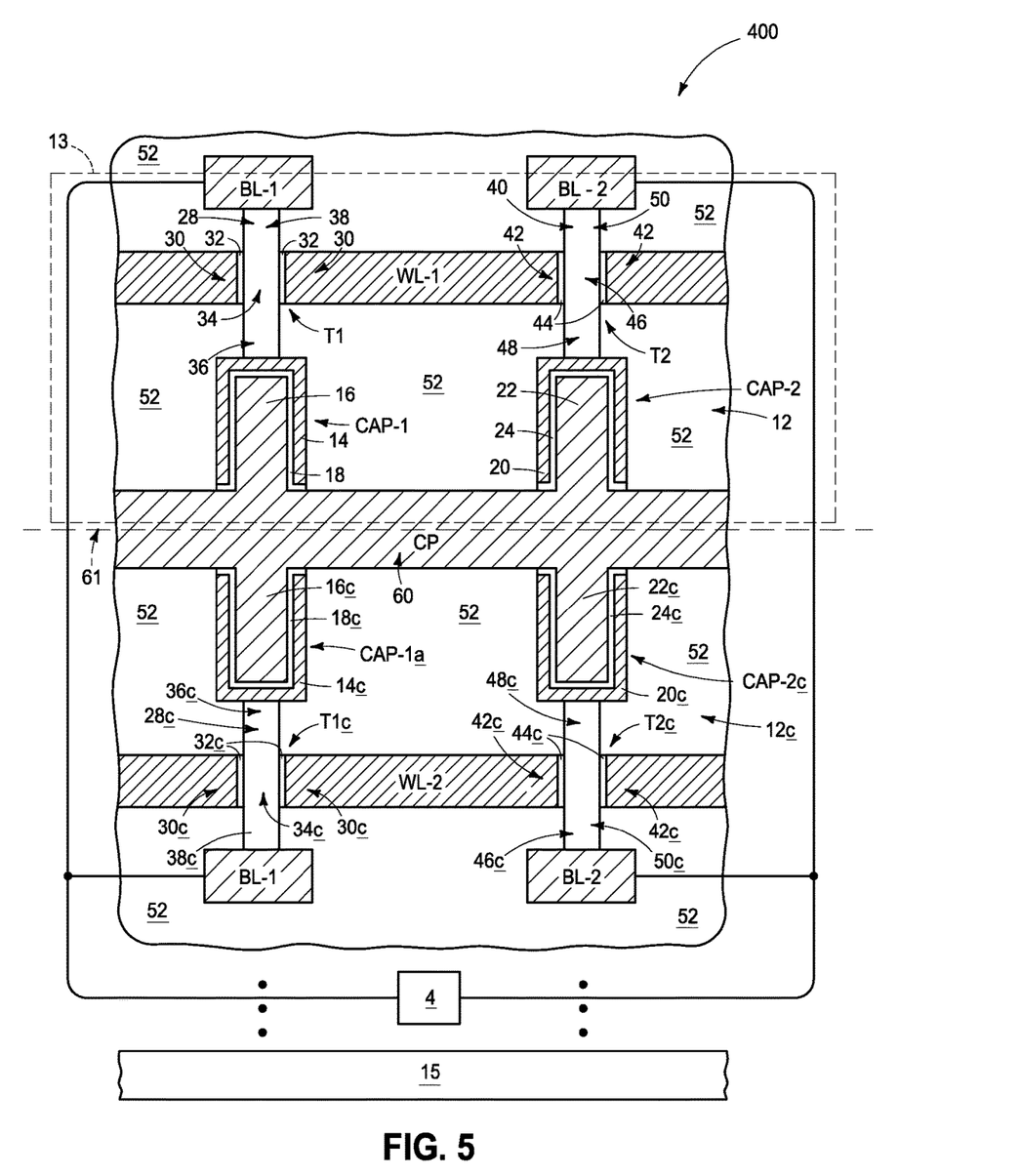

FIG. 5 shows a portion of a memory array 400 comprising a pair of memory cells 12 and 12c, with the cell 12 being vertically stacked over the cell 12c. A dashed line 13 demarcates an approximate boundary of the memory cell 12.

The illustrated portion of memory array 400 is supported by a base 15.

A horizontally-extending rail 60 is between the memory cells 12 and 12c, and extends along the cross-section of FIG. 5. The rail 60 has a voltage corresponding to the common plate (CP), and is shared by the memory cells 12 and 12c. In some embodiments the rail may be referred to as a common plate structure.

The memory cell 12 comprises first and second transistors T1 and T2 which are laterally displaced relative to one another. The memory cell 12 comprises the first capacitor CAP-1 below the first transistor T1, and comprises the second capacitor CAP-2 below the second transistor T2.

The first capacitor CAP-1 comprises the first conductive node 14, second conductive node 16, and first capacitor dielectric material 18; and the second capacitor CAP-2 comprises the third conductive node 20, fourth conductive node 22, and second capacitor dielectric material 24.

The second and fourth conductive nodes 16 and 22 are electrically coupled with the rail 60. In the illustrated embodiment the conductive nodes 16 and 22 share a common composition with the rail 60. In other embodiments the rail 60 may comprise a different composition as compared to the conductive nodes 16 and 22. The rail 60 may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The first and second capacitors CAP-1 and CAP-2 are laterally displaced relative to one another, with the second capacitor CAP-2 being in a same horizontal plane as the first capacitor CAP-1. The first transistor T1 is between the first capacitor CAP-1 and a first comparative bitline BL-1, and the second transistor T2 is between the second capacitor CAP-2 and a second comparative bitline BL-2. The first and second comparative bitlines BL-1 and BL-2 extend in and out of the page relative to the cross-section of FIG. 5.

In the shown embodiment the first and second transistors T1 and T2 are in a common horizontal plane as one another, and the wordline WL-1 extends along such horizontal plane and comprises the gates 30 and 42 of the first and second transistors.

The first semiconductor pillar 28 extends downwardly from the first comparative bitline BL-1 to the first conductive (or outer conductive) node 14 of the first capacitor CAP-1, and the first transistor T1 is along such first semiconductor pillar 28. The second semiconductor pillar 40 extends downwardly from the second comparative bitline BL-2 to the third conductive (or outer conductive) node 20 of the second capacitor CAP-2, and the second transistor T2 is along such second semiconductor pillar 40.

The first transistor T1 includes the gate dielectric material 32, the first channel region 34, and the first and second source/drain regions 36 and 38. The first source/drain region 36 is electrically coupled with the first conductive node 14 of first capacitor CAP-1, and the second source/drain region 38 is electrically coupled with the first comparative bitline BL-1.

The second transistor T2 includes the gate dielectric material 44, the second channel region 46, and the third and fourth source/drain regions 48 and 50. The third source/drain region 48 is electrically coupled with the third conductive node 20 of second capacitor CAP-2, and the fourth source/drain region 50 is electrically coupled with the second comparative bitline BL-2.

The memory cell 12c is similar to memory cell 12, and comprises first and second capacitors CAP-1c and CAP-2c together with first and second transistors T1c and T2c. The first and second transistors T1c and T2c comprise conductive gates 30c and 42c which are electrically coupled with a second wordline WL-2. The second and fourth (or inner conductive) nodes 16c and 22c of the first and second capacitors CAP-1b and CAP-2b are electrically coupled with the rail 60.

An axis 61 extending along the rail 60 may be considered to define a mirror plane. The memory cell 12c may be considered to be a substantially mirror image of the memory cell 12 across the mirror plane. The term "substantially mirror image" is utilized to indicate that the memory cell 12c may be a mirror image of the memory cell 12 to within reasonable tolerances of fabrication and measurement.

In the illustrated embodiment the first comparative bitline BL-1 of memory cell 12 (i.e., the comparative bitline BL-1 above wordline WL-1) and the first comparative bitline of memory cell 12c (i.e., the comparative bitline BL-1 below wordline WL-2) are electrically coupled to one another; and the second comparative bitline BL-2 of memory cell 12 (i.e., the comparative bitline BL-2 above wordline WL-1) and the second comparative bitline of memory cell 12c (i.e., the comparative bitline BL-2 below wordline WL-2) are electrically coupled to one another. Electrical properties of the coupled comparative bitlines BL-1 are compared with those of the coupled comparative bitlines BL-2 with circuitry 4 of the type described above with reference to FIG. 1.

In some embodiments the configuration of FIG. 5 may be considered to comprise memory cells within $8F^2$ architecture.

The structures and architectures described above may be incorporated into memory (e.g., DRAM, MRAM, FERAM, etc.) and/or otherwise may be utilized in electronic systems. Such electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell having first and second transistors and first and second capacitors. The first capacitor is vertically displaced relative to the first transistor. The first capacitor has a first node electrically coupled with a source/drain region of the first transistor, a second node electrically coupled with a common plate structure, and a first capacitor dielectric material between the first and second nodes. The second capacitor is vertically displaced relative to the second transistor. The second capacitor has a third node electrically coupled with a source/drain region of the second transistor, a fourth node electrically coupled with the common plate structure, and a second capacitor dielectric material between the first and second nodes.

Some embodiments include a memory cell having first and second transistors laterally displaced relative to one another, and having first and second capacitors. The first capacitor is vertically displaced relative to the first transistor. The first capacitor has a first node electrically coupled with a source/drain region of the first transistor, a second node electrically coupled with a common plate structure, and a first capacitor dielectric material between the first and second nodes. The second capacitor is vertically displaced relative to the second transistor. The second capacitor has a third node electrically coupled with a source/drain region of the second transistor, a fourth node electrically coupled with the common plate structure, and a second capacitor dielectric material between the first and second nodes.

Some embodiments include a memory cell having first and second transistors vertically displaced relative to one another, and having first and second capacitors. The first capacitor is above the first transistor. The first capacitor has a first node electrically coupled with a source/drain region of the first transistor, a second node electrically coupled with a common plate structure, and a first capacitor dielectric material between the first and second nodes. The second capacitor is above the first capacitor and under the second transistor. The second capacitor has a third node electrically coupled with a source/drain region of the second transistor, a fourth node electrically coupled with the common plate structure, and a second capacitor dielectric material between the first and second nodes.

Some embodiments include an apparatus having a semiconductor base, a plurality of memory cells, and an insulating film intervening between the semiconductor base and the plurality of memory cells. Each of the memory cells has a first transistor and a first capacitor. The first transistor has first source and first drain regions and a first channel region therebetween, and the first capacitor including first and second nodes and a first dielectric film therebetween. The first transistor and the first capacitor are arranged such that the first source and first drain regions of the first transistor and the first and second nodes of the first capacitor are vertically disposed with one another with an electrical connection between one of the first source and first drain regions of the first transistor and one of the first and second nodes of the first capacitor.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array, comprising:
a plurality of memory cells; each memory cell of said plurality having a two transistor two capacitor (2T-2C) configuration and comprising:
first and second transistors laterally displaced relative to one another;
a first capacitor vertically displaced relative to the first transistor, the first capacitor having a first node electrically coupled with a source/drain region of the first transistor, having a second node electrically coupled with a common plate structure, and having a first capacitor dielectric material between the first and second nodes;

a second capacitor vertically displaced relative to the second transistor, the second capacitor having a third node electrically coupled with a source/drain region of the second transistor, having a fourth node electrically coupled with the common plate structure, and having a second capacitor dielectric material between the first and second nodes; and wherein:

the first transistor has a first source/drain region and a second source/drain region, and the first node is electrically coupled with the first source/drain region;

the second transistor has a third source/drain region and a fourth source/drain region, and the third node is electrically coupled with the third source/drain region; and the second and fourth source/drain regions are electrically coupled with first and second comparative bitlines, respectively; and wherein an axis through the first and second comparative bitlines defines a mirror plane; and wherein a second memory cell of said plurality is on an opposing side of the mirror plane from a first memory cell of said plurality and is substantially a mirror image of said first memory cell across the mirror plane; said second memory cell sharing the first and second comparative bitlines with said first memory cell.

2. The memory array of claim 1 wherein a common wordline extends to both of the first and second transistors of said first memory cell and comprises gates of the first and second transistors of said first memory cells.

3. The memory array of claim 2 wherein the first and second capacitors of said first memory cell are in a common horizontal plane as one another.

4. The memory array of claim 1 wherein the first and third nodes of said first memory cell are container-shaped, and wherein the second and fourth nodes of said first memory cell extend into the container-shaped first and third nodes, respectively.

5. The memory array of claim 1 wherein the first and second comparative bitlines are a same vertical thickness as one another and in a common horizontal plane as one another.

* * * * *